United States Patent
Yoshii et al.

(10) Patent No.: US 7,367,117 B2
(45) Date of Patent: May 6, 2008

(54) ELECTRONIC COMPONENT MOUNTING APPARATUS AND ELECTRONIC COMPONENT MOUNTING METHOD

(75) Inventors: Takashi Yoshii, Ota (JP); Akihiro Urakawa, Ota (JP)

(73) Assignee: Hitachi High-Tech Instruments Co. Ltd., Gunma (JP)

( * ) Notice: Subject to any disclaimer, the term of this patent is extended or adjusted under 35 U.S.C. 154(b) by 137 days.

(21) Appl. No.: 11/134,498

(22) Filed: May 23, 2005

(65) Prior Publication Data

US 2005/0274004 A1 Dec. 15, 2005

(30) Foreign Application Priority Data

May 31, 2004 (JP) ............................. 2004-160716

(51) Int. Cl.
 *H05K 3/30* (2006.01)
 *H05K 3/34* (2006.01)
(52) U.S. Cl. .............................. 29/833; 29/840; 29/852
(58) Field of Classification Search ................. 29/832, 29/833, 840, 852
See application file for complete search history.

(56) References Cited

U.S. PATENT DOCUMENTS

| | | | | |
|---|---|---|---|---|
| 6,144,452 | A * | 11/2000 | Hachiya | 356/615 |
| 6,380,537 | B1 * | 4/2002 | Suhara et al. | 250/239 |
| 6,429,387 | B1 * | 8/2002 | Kuribayashi et al. | 174/261 |
| 6,496,248 | B2 * | 12/2002 | Tanaka | 355/72 |
| 6,788,385 | B2 * | 9/2004 | Tanaka et al. | 355/53 |
| 6,885,905 | B2 * | 4/2005 | Kodama et al. | 700/116 |
| 6,915,565 | B2 * | 7/2005 | Isogai et al. | 29/833 |
| 6,938,335 | B2 * | 9/2005 | Kuribayashi et al. | 29/834 |
| 2002/0035783 | A1 * | 3/2002 | Kawada | 29/833 |
| 2004/0098857 | A1 * | 5/2004 | Kawada | 29/740 |
| 2005/0128344 | A1 * | 6/2005 | Suhara et al. | 348/370 |

FOREIGN PATENT DOCUMENTS

JP 2001-304828 10/2001

* cited by examiner

Primary Examiner—C. J Arbes
(74) Attorney, Agent, or Firm—Morrison & Foerster LLP

(57) ABSTRACT

The invention prevents mismounting of an electronic component caused by missetting of a component feeding unit in an apparatus. A recognition process of an electronic component is performed according to component library data stored in a RAM. According to "normal" data as a check condition in the component library data, a recognition processing device checks whether leads indicated by group numbers "1" and "2" exist or not in the electronic component, on command of a CPU. When all the leads are detected, the CPU commands the recognition processing device to calculate an amount of shifting from a proper position based on an image taken by a component recognition camera, and a position and an angle of the electronic component are calculated. Next, the recognition processing device performs an absence check of leads which must not exist in the electronic component. When even one of the leads which must not exist is detected, the CPU judges the electronic component the "lead detection error in absence check", so that the CPU makes the electronic component released from a suction nozzle and collected in an exhaust box.

3 Claims, 4 Drawing Sheets

FIG.3
| group No. | group direction | type width | length | number | pitch | position | check conditon |
|---|---|---|---|---|---|---|---|
| 1 | 0° | OO.0mm | OO.0mm | 1 | OO.0mm | OO.0mm | normal |
| 2 | 180° | OO.0mm | OO.0mm | 2 | OO.0mm | OO.0mm | normal |
| 3 | 0° | OO.0mm | OO.0mm | 2 | OO.0mm | OO.0mm | absence check |
| 4 | 180° | OO.0mm | OO.0mm | 1 | OO.0mm | OO.0mm | absence check |
FIG.4
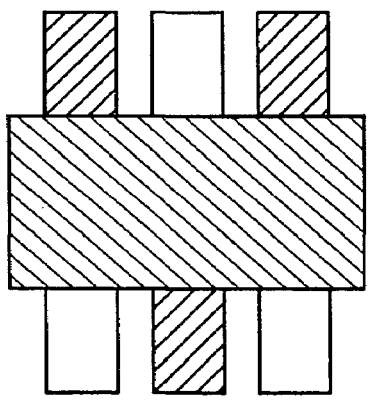
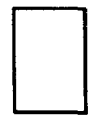 check condition   normal
lead which must exist
 check condition   absence check
lead which must not exist

US 7,367,117 B2

ELECTRONIC COMPONENT MOUNTING APPARATUS AND ELECTRONIC COMPONENT MOUNTING METHOD

CROSS-REFERENCE OF THE INVENTION

This invention is based on Japanese Patent Application No. 2004-160716, the content of which is incorporated by reference in its entirety.

BACKGROUND OF THE INVENTION

1. Field of the Invention

The invention relates to an electronic component mounting apparatus and an electronic component mounting method in which an electronic component is picked up from any one of component feeding units by a suction nozzle, an image of the electronic component held by suction by the suction nozzle is taken by a component recognition camera, the image is recognized by a recognition processing device, and the electronic component is mounted on a printed board.

2. Description of the Related Art

This kind of electronic component mounting apparatus has been known in the art. Exemplary structures are disclosed in Japanese Patent Application Publication No. 2001-304828. For an electronic component with leads, a BGA (Ball Grid Array), or a CSP (Chip Size Package), generally, detection is performed only to leads or solder balls of which the information is stored in component library data. When leads or solder balls of which the information is not stored therein exist, these are ignored and processes are continued.

Therefore, in a case of mistakenly setting in a component mounting apparatus a component feeding unit supplying different electronic components instead of setting a component feeding unit supplying predetermined components, a recognized electronic component having a more number of leads or solder balls than a predetermined number can not be judged erroneous. In detail, when the recognition process is performed to a TR6-pin electronic component (i.e. a transistor with 6 leads) based on component library data for a TR3-pin electronic component (i.e. a transistor with 3 leads), the TR6-pin component is not judged erroneous and mistakenly mounted on a printed board.

SUMMARY OF THE INVENTION

The invention provides an electronic component mounting apparatus that includes a component feeding unit feeding an electronic component to a component feeding position, a suction nozzle picking up the electronic component by suction from the component feeding unit and mounting the electronic component on a printed board, a component recognition camera taking an image of the electronic component held by suction by the suction nozzle, a memory stored with data on a connection terminal that is not part of an electronic component of a mounting operation, and a recognition processing device determining whether the electronic component held by the suction nozzle has the connection terminal based on the image taken by the component recognition camera.

The invention also provides a method of mounting an electronic component. The method includes storing in a memory data on a connection terminal that is not part of an electronic component of a mounting operation, providing a component feeding unit that containing electronic components, picking up one of the electronic components by suction from the component feeding unit using a suction nozzle, taking an image of the electronic component held by the suction nozzle using a component recognition camera, determining whether the electronic component held by the suction nozzle has the connection terminal based on the image taken by the component recognition camera and the data stored in the memory, and stopping the mounting operation when it is determined that the electronic component held by the suction nozzle has the connection terminal.

BRIEF DESCRIPTION OF THE DRAWINGS

FIG. 3 is a table showing component library data for the apparatus of FIG. 1.

FIG. 4 is a plan view of an electronic component for explaining check conditions for the apparatus of FIG. 1.

DETAILED DESCRIPTION OF THE INVENTION

Figure 1:
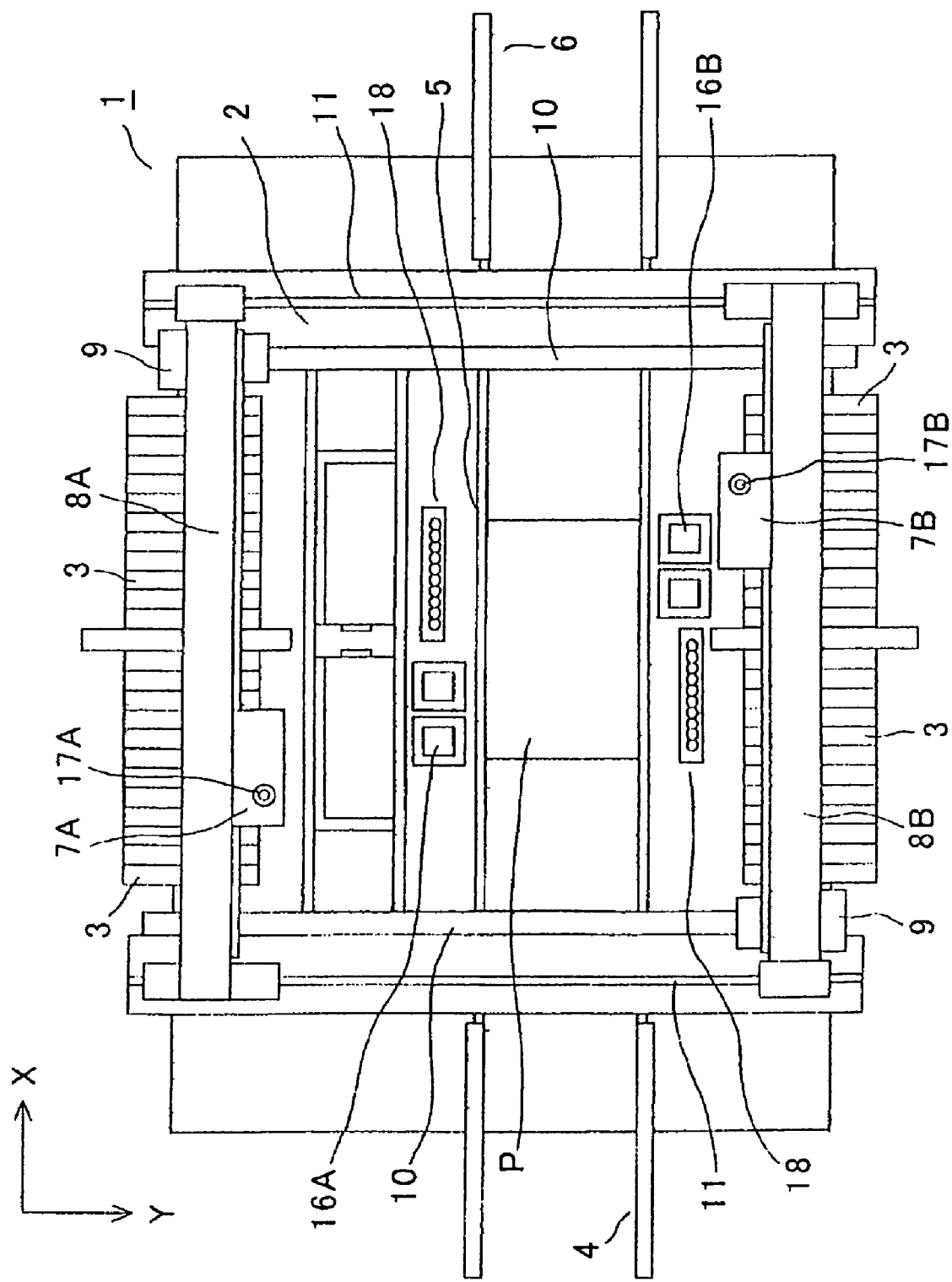
FIG. 1 is a plan view of an electronic component mounting apparatus of an embodiment of the invention.

An embodiment of the invention will be described with reference to drawings. FIG. 1 is a plan view of an electronic component mounting apparatus 1. A plurality of component feeding units 3 for feeding a variety of electronic components one by one to each of component pickup portions (component pickup positions) is attachably and detachably aligned and fixed on a component feeding table (not shown) on a mounting apparatus body 2 of the apparatus 1. A supply conveyer 4, a positioning portion 5, and a discharge conveyer 6 are provided between groups of the units 3 facing to each other. The supply conveyor 4 conveys a printed board P received from an upstream to the positioning portion 5, an electronic component is mounted on the printed board P positioned by a positioning device (not shown) at the positioning portion 5, and the printed board P is conveyed to the discharge conveyer 6.

Numerals 8A and 8B designate a pair of beams extending in an X direction. The beams 8A and 8B respectively move in a Y direction above the printed board P or the component pickup portions (component pickup positions) of the component feeding units 3 along a pair of left and right guides 11, by rotation of screw axes 10 driven by linear motors 9.

The beams 8A and 8B are respectively provided with mounting heads 7A and 7B which move in a longitudinal direction, i.e., in the X direction along a guide (not shown) driven by an X axis motor 12. Each of the mounting heads 7A and 7B has a vertical axis motor 14 for vertically moving each of suction nozzles 17A and 17B and a θ axis motor 15 for rotating each of the suction nozzles 17A and 17B around a vertical axis. Therefore, the suction nozzles 17A and 17B of the two mounting heads 7A and 7B can move in the X direction and the Y direction, rotate around the vertical axis, and move vertically.

Numerals 16A and 16B designate component recognition cameras for recognizing a position of the electronic component. Two component recognition cameras are provided for the suction nozzles 17A and 17B. Each of the cameras 16A and 16B takes an image of the electronic component to detect an amount of shifting from a proper position of the electronic component on the suction nozzle in the X and Y directions and at rotating angles. Each of the cameras 16A and 16B can also take an image of two electronic components at the same time. Numerals 18 designate nozzle stockers stored with a variety of suction nozzles. Although the nozzle stocker can be stored with ten suction nozzles at maximum, nine suction nozzles are stored therein.

Figure 2:
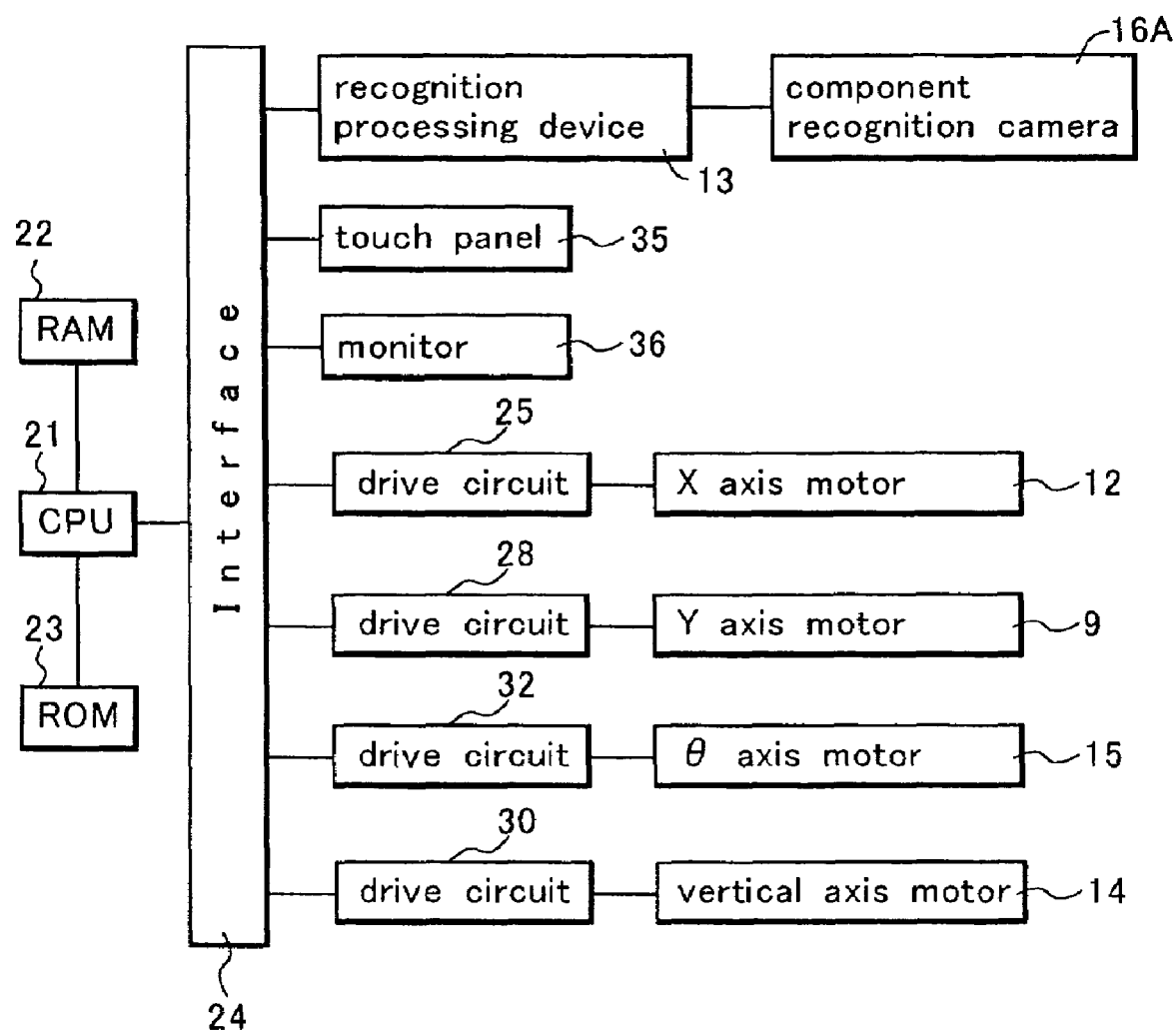
FIG. 2 is a control block diagram of the apparatus of FIG. 1.

FIG. 2 shows a control block diagram of the electronic component mounting apparatus 1 of the invention. Description will be made hereafter by showing one X axis motor 12, one Y axis motor 9, one θ axis motor 15, and one vertical axis motor 14 only in FIG. 2, for the convenience of description.

The electronic component mounting apparatus 1 has a CPU 21 as a control portion controlling component mounting operations of the electronic component mounting apparatus 1, and a RAM (random access memory) 22 and a ROM (read only memory) 23 as storing devices.

The RAM 22 is stored with mounting data for each of types of the printed board P, which include values in the X and Y directions and an angle on the printed board, alignment numbers of the component feeding units 3, and so on in order of component mounting (in order of step number). Furthermore, the RAM 22 is stored with component disposition data which include types of the electronic components (component ID) corresponding to the alignment numbers (lane numbers) of the component feeding units 3. Furthermore, the RAM 22 is stored with component library data including features of leads such as group numbers, group directions, lengths in the X and Y directions, number, pitches, positions, and check conditions of leads, which are sorted by the component ID.

Component library data of a TR3-pin electronic component shown in FIG. 4 are shown in FIG. 3, for example. Data indicated by a group number "1" in a top row show data on a lead on the side of the component where one lead exists. Data indicated by a group number "2" in a second row show data on a lead on the side of the component where two leads exist. Data indicated by a group number "3" in a third row show data on a lead which must not exist on the side of the component where one lead exists. Data indicated by a group number "4" in a fourth row show data on a lead which must not exist on the side of the component where two leads exist.

White leads of the electronic component shown in FIG. 4 indicate that the check condition of the leads is "normal", where existence of the leads which must exist or bending of the leads are checked as normally. Hatched leads indicate that the check condition of the leads is "absence check", where the absence of the leads which must not exist is confirmed.

Then, the CPU 21 controls a component mounting operation of the electronic component mounting apparatus 1 based on data stored in the RAM 22 and according to a program stored in the ROM 23. That is, the CPU 21 controls driving of the X axis motor 12, the Y axis motor 9, the θ axis motor 15, and the vertical axis motor 14 respectively through the drive circuit 25, the drive circuit 28, the drive circuit 32, and the drive circuit 30.

A numeral 13 designates a recognition processing device connected with the CPU 21 through an interface 24. The recognition processing device 13 performs a recognition process to images taken and stored by the component recognition cameras 16A and 16B, and sends a recognition result to the CPU 21. That is, the CPU 21 outputs a command to perform the recognition process (e.g. calculation of a shifting amount of an electronic component from a proper position) to images taken and stored by the component recognition cameras 16A and 16B to the recognition processing device 13, and receives the recognition processing result from the recognition processing device 13.

That is, when the recognition processing device 13 performs the recognition process and detects a shifting amount from a proper position, this recognition result is sent to the CPU 21. Then, the CPU 21 moves the beams 8A and 8B in the Y direction by driving the Y axis motor 9, the mounting heads 7A and 7B in the X direction by driving the X axis motor 12, and rotates the suction nozzles 17A and 17B by an angle θ by driving the θ axis motor 15, thereby completing correction of the position of the electronic component in the X and Y directions and the rotating angle along the vertical axis.

A monitor 36 as a display device has various touch panel switches 35 as an input device for setting data, and an operator operates the touch panel switches 35 for various settings. A key board can be used as the input device for setting data, instead.

Under the described structure, an operation will be described particularly based on FIG. 3. Although there are two mounting heads 7A and 7B, the mounting head 7A is used as an example for the convenience of description. First, the printed board P is conveyed from an upstream device (not shown) to the positioning portion 5 through the supply conveyer 4, and fixed by the positioning device. Then, the suction nozzle 17A corresponding to the type of the electronic component picks up the electronic component to be mounted from the predetermined component feeding unit 3 according to the mounting data stored in the RAM 22, in which the X and Y coordinates on the printed board P and the rotation angle around the vertical axis for mounting the component, a FDR number (the alignment number of each of the component feeding units), and so on are specified.

In detail, the suction nozzle 17A of the mounting head 7A moves to position above the component feeding unit 3 stored with the electronic component to be mounted having a mounting step number 0001. The movement in the Y direction is made by movement of the beam 8A along the pair of guides 11 by the Y axis motor 9 driven by the drive circuit 28. The movement in the X direction is made by movement of the mounting head 7A by the X axis motor 12 driven by the drive circuit 25. Since the electronic component is ready to be picked up at the component pickup position in the predetermined feeding unit 3, the vertical axis motor 14 is driven by the drive circuit 30 and the suction nozzle 17A descends to pick up the electronic component.

Then, the CPU 21 moves the suction nozzle 17A to above the component recognition camera 16A by the Y axis motor 9 and the X axis motor 25. The component recognition camera 16A takes an image of this electronic component held by suction by the suction nozzle 17A, and the recognition processing device 13 performs the recognition process to the image taken.

Figure 5:
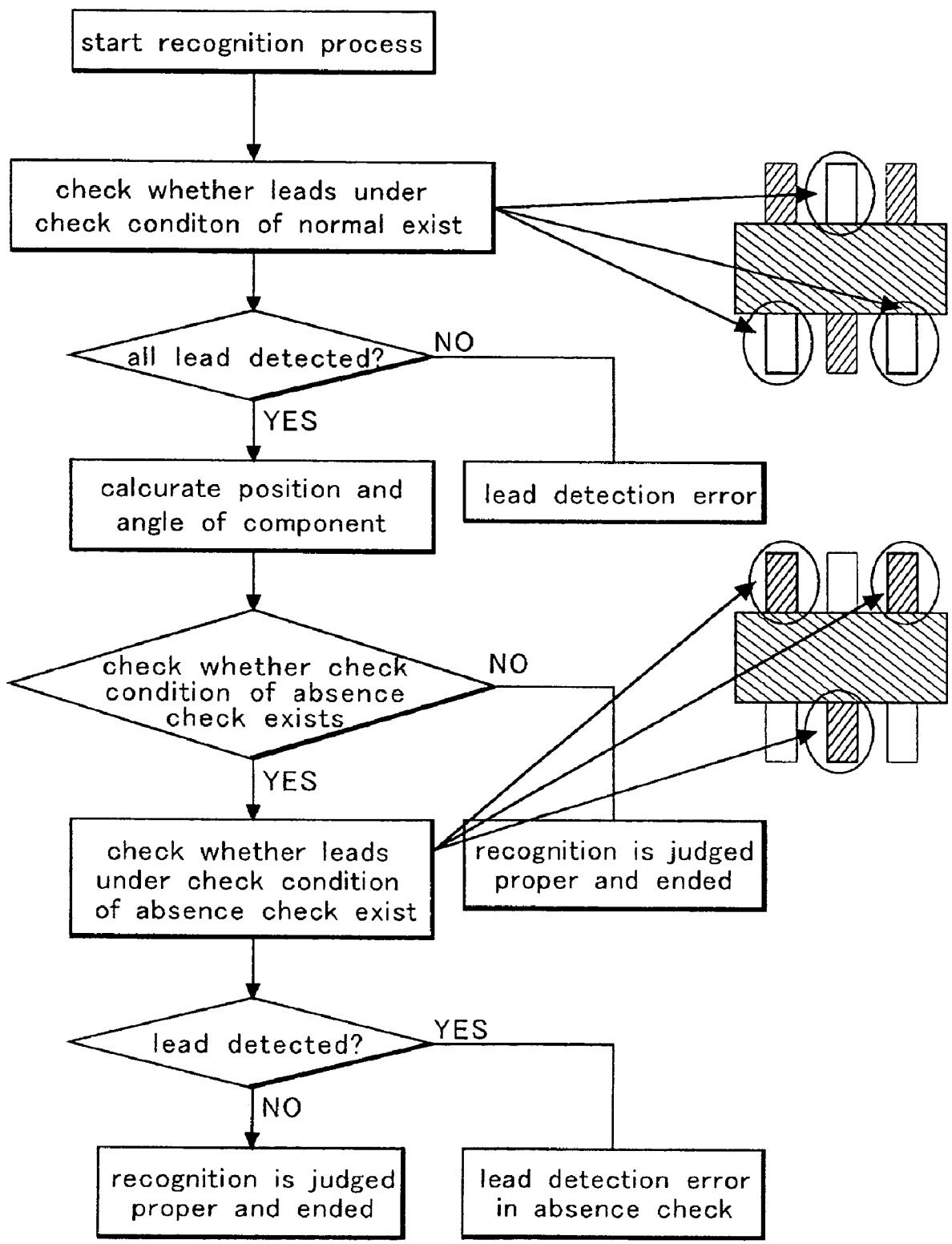
FIG. 5 is a flow chart of a recognition process for the apparatus of FIG. 1.

The recognition process will be described based on FIG. 5 showing a flowchart of the recognition process. First, the recognition process is performed according to the component library data stored in the RAM 22, the component library data being formed based on the component disposition data about the types of the electronic components corresponding to the alignment numbers of the component feeding units 3 in order of mounting. Hereafter, description will be made, supposing the electronic component to be the TR-3 pin electronic component.

First, on command of the CPU 21, the recognition processing device 13 checks whether the leads indicated by the group numbers "1" and "2", which must exist, exist or not, according to "normal" data as the check condition in the component library data. In this case, when the recognition processing device 13 detects one lead on one side of the electronic component and two leads on the other side thereof, the electronic component corresponds to the data shown in the top and second rows. Therefore, based on the recognition processing result of the recognition processing device 13, the CPU 21 judges that all the leads which must exist in the electronic component exist. Then, the CPU 21 commands the recognition processing device 13 to perform a recognition process (such as calculation of an amount of shifting from a proper position) to the image taken by the component recognition camera 16A, and the recognition processing device 13 calculates the position and angle of the electronic component based on the image taken. When the recognition processing device 13 does not detect all the leads (three leads) when checking whether the leads which must exist exist or not as described above, the CPU 21 determines that the recognition processing result is "lead detection error", and releases vacuum suction of the electronic component, so that the electronic component is released from the suction nozzle 17A at a predetermined position and collected in an exhaust box.

After the position and angle of the electronic component are calculated as described above, the CPU 21 checks whether the "absence check" data as the check condition exist or not. If the "absence check" data are not found, the CPU 21 judges the recognition processing result proper and ends the recognition process. However, when the CPU 21 detects (recognizes) the "absence check" data stored in RAM 22, the recognition processing device 13 performs an absence check (detection) of the lead which must not exist, on command of the CPU 21.

The recognition processing device 13 checks whether the leads hatched in FIG. 4 which must not exist exist or not, that is, whether two leads on one side of the electronic component and one lead on the other side thereof exist or not. When the CPU 21 judges that any of the leads, which must not exist, is not detected, the CPU 21 judges the recognition processing result proper and ends the recognition process. On the other hand, when even one lead is detected, the CPU 21 determines that the recognition processing result is "lead detection error in absence check", and releases vacuum suction of the electronic component, so that the electronic component is released from the suction nozzle 17A at the predetermined position and collected in the exhaust box. Then, the CPU 21 controls the electronic component mounting apparatus to stop. In this case, the CPU 21 can display the component feeding unit 3 feeding this electronic component on the monitor 36.

Accordingly, when the CPU 21 determines that the recognition processing result is "lead detection error in absence check", it is inferred that the component feeding unit 3 is misset (set in a different position) on the component feeding table which is the apparatus body. Therefore, an operator sets a proper component feeding unit 3 in a predetermined position, so that components other than proper components for the mounting operation are prevented from being mistakenly mounted on the printed board P.

After the recognition processing result is judged proper and the recognition process is ended, the result of a shifting amount from a proper position of the component which is obtained in the recognition process by the recognition processing device 13 is sent to the CPU 21. Then, the CPU 21 moves the beams 8A in the Y direction by driving the Y axis motor 9, the mounting heads 7A in the X direction by driving the X axis motor 12, and rotates the suction nozzle 17A by an angle θ by driving the θ axis motor 15, thereby completing correction of the position of the electronic component in the X and Y directions and the rotating angle along the vertical axis. Then, the electronic component is mounted on the printed board P.

Although this embodiment is described by employing the electronic component with leads as an example, the invention is not limited to this and can be applied to a BGA (Ball Grid Array) with solder balls. In this case, the RAM 22 is stored with component library data including features of the solder balls (for both solder balls which must exist and not exist) such as sizes, number, pitches, positions or check conditions of the solder balls. The recognition process is performed based on this component library data. When the solder ball is detected in a position where the solder ball must not exist, a component feeding direction is found mistaken (polarity error) based on this detection result.

A multifunctional chip mounter a suction nozzle of which is movable in X and Y directions on a horizontal plane is used as an example of the electronic component mounting apparatus of this embodiment. However, the invention is not limited to this and can be applied to a high-speed chip mounter of a rotary table type.

Although the particular preferred embodiment of the invention has been disclosed in detail, it will be recognized that variations or modifications of the disclosed apparatus, including the rearrangement of parts, are possible and lie within the scope of the invention.

What is claimed is:

1. A method of mounting an electronic component, comprising:
    storing in a memory data on connection terminals for a predetermined type of electronic component to be mounted in a mounting operation;
    providing a component feeding unit containing electronic components;
    picking up one of the electronic components by suction from the component feeding unit using a suction nozzle;
    taking an image of the electronic component held by the suction nozzle using a component recognition camera;
    determining whether the electronic component held by the suction nozzle has all the connection terminals of the predetermined type of electronic component based on the image taken by the component recognition camera and the data stored in the memory;
    determining whether the electronic component held by the suction nozzle has a connection terminal that is not of the predetermined type of electronic component based on the image taken by the component recognition camera and the data stored in the memory, only when it is determined that the electronic component held by the suction nozzle has all the connection terminals of the predetermined type of electronic component; and
    stopping the mounting operation when it is determined that the electronic component held by the suction nozzle does not have all the connection terminals of the predetermined type of electronic component or that the electronic component held by the suction nozzle has a connection terminal that is not of the predetermined type of electronic component.

2. The method of claim 1, wherein the connection terminals are leads or solder balls.

3. The method of claim 1, wherein the data on connection terminals for the predetermined type of electronic component comprises data on sizes and locations of the connection terminals of the predetermined type of electronic component and data on sizes and locations of connection terminals of an electronic component that is not of the predetermined type of electronic component.

* * * * *